(12) United States Patent
Shastry et al.

(10) Patent No.: US 9,024,704 B2
(45) Date of Patent: May 5, 2015

(54) ELECTRONICALLY TUNABLE ACTIVE DUPLEXER SYSTEM AND METHOD

(71) Applicant: Bradley University, Peoria, IL (US)

(72) Inventors: Prasad Narasimha Shastry, Washington, IL (US); Sureshbabu Sundaram, Dunlap, IL (US); Balamurugan Sundaram, Dunlap, IL (US)

(73) Assignee: Bradley University, Peoria, IL (US)

( * ) Notice: Subject to any disclaimer, the term of this patent is extended or adjusted under 35 U.S.C. 154(b) by 166 days.

(21) Appl. No.: 13/662,097

(22) Filed: Oct. 26, 2012

(65) Prior Publication Data

US 2014/0118083 A1    May 1, 2014

(51) Int. Cl.
*H03H 7/48*       (2006.01)
*H01P 5/12*       (2006.01)
*H03H 11/04*      (2006.01)
*H03H 11/34*      (2006.01)

(52) U.S. Cl.
CPC ......... *H03H 11/0466* (2013.01); *H03H 11/344* (2013.01)

(58) Field of Classification Search
USPC .................. 333/126–129, 132, 134; 330/286
See application file for complete search history.

(56) References Cited

U.S. PATENT DOCUMENTS

| | | | | |
|---|---|---|---|---|
| 4,961,062 | A * | 10/1990 | Wendler | 333/164 |
| 5,032,806 | A * | 7/1991 | Nakahara | 333/161 |
| 7,576,627 | B2 * | 8/2009 | Shastry et al. | 333/132 |
| 7,633,435 | B2 * | 12/2009 | Meharry et al. | 342/198 |

\* cited by examiner

*Primary Examiner* — Robert Pascal
*Assistant Examiner* — Kimberly Glenn
(74) *Attorney, Agent, or Firm* — Kutak Rock LLP; Marcellus A. Chase

(57) ABSTRACT

This invention provides a novel electronically tunable active duplexer for wireless transceiver applications. It relates to an active duplexer with full-duplex operation, permitting simultaneous transmission and reception of signals at same or different frequencies. Instead of incorporating fixed or mechanically adjustable capacitors, and even instead of incorporating varactor diodes, it incorporates one or more capacitance tuning circuit in phase shifting networks enabling one to electronically tune, with ease and precision, the frequency at which isolation is desired, over a band in both transmit and receive modes of operations.

33 Claims, 8 Drawing Sheets

ELECTRONICALLY TUNABLE ACTIVE DUPLEXER SYSTEM AND METHOD

FIELD

The present inventive concept relates to a transceiver antenna, especially an electronically tunable active duplexer for wireless transceiver applications. Specifically, it relates to an active duplexer that includes one or more capacitance tuning circuit to allow for continuous electronic tuning, which permits the simultaneous transmission and reception of signals at same or different frequencies.

BACKGROUND

A duplexer is a critical component in the functioning of wireless transceivers, such as mobile phones, wireless network adapters, and PDAs. It allows simultaneous transmission and reception of signals from a single antenna. It provides isolation between transmitter and receiver. Generally speaking, the duplexers currently used in transceivers are passive filters and hence have insertion loss across the device. Furthermore, they are not tunable, or if they are tunable, they are not tunable electronically, and they do not provide amplification of transmitted and received signals.

Bi-Directional Distributed Amplifier

The current state of the art of antenna duplexers are based on bi-directional distributed amplifier (DA) architecture (see reference 1 [infra], which is herein incorporated by reference). A DA is inherently bi-directional because of the symmetry in its architecture. The signal paths in an exemplary DA are shown in FIG. 1. $S_{21}$ and $S_{34}$ represent the gains in the two directions.

A DA can be designed in such a way to produce low crosstalk between isolated ports, represented by $S_{31}$ and $S_{24}$ (see references 2, 3, and 4 [infra], which are herein incorporated by reference). Specifically, this is achieved by inserting phase shifting networks between the distributed amplifier gain cells (DA cells) to cancel the signals at the isolated ports at a given frequency as shown in FIG. 2 (see reference 3). Yet, the active duplexers reported in references 2 and 3 are not tunable. However, the isolation level and frequency can be slightly adjusted in those duplexers by replacing the fixed capacitors in the phase shifting networks (references 2 and 3) with mechanically adjustable capacitors (reference 4).

Antenna Configurations

The functionality of a state-of-the-art active duplexer as a T/R (Transmit/Receive) module with antenna connection options is shown schematically in FIG. 2. Each DA cell is comprised of a Field Effect Transistor (FET) and gate and drain line inductors (reference 1). The tunable phase shifting networks between the DA cells are designed such that the signals arriving at port 3, from port 1, through the DA cells are out of phase with each other and hence cancel. Therefore, port 3 is isolated from port 1.

This allows one to connect a transmitter at port 1 and a receiver at port 3. Since a DA is a symmetrical device, cancellation of the signals arriving at port 2 will also occur when a wave enters port 4. Bandpass filters R and T (designed to pass receive and transmit frequencies respectively) may be included to further enhance the isolation between the isolated ports. Various antenna/duplexer configurations can be implemented, which are described below and referenced throughout this disclosure.

Configuration A. Antenna Connected to Ports 2 and 4

If an antenna is connected to ports 2 and 4; in the transmit mode, the signal is amplified from port 1 to port 2. During the receive mode the signal is amplified from port 4 to port 3. The received signal is prevented from entering the transmitting antenna because of isolation between ports 2 and 4. This configuration requires isolation between ports 1 and 3, and ports 2 and 4.

Configuration B. Antenna at Port 4

If an antenna is connected to port 4 with port 2 terminated; in the transmit mode, the signal is attenuated along the gate line of the DA. The attenuation can be overcome by amplifying the signal at port 1. However, during the receive mode, the signal is amplified from port 4 to port 3.

Configuration C. Antenna at Port 2

If an antenna is connected to port 2 with port 4 terminated; in the transmit mode, the signal is amplified from port 1 to port 2. During the receive mode, the signal is attenuated along the drain line. Further, the noise figure of the duplexer increases. Therefore, ordinarily, this configuration is not a viable option.

Previous Attempts at a Tunable Duplexer

The duplexer field is fairly well enabled by the engineering as well as the patent literature. For example, U.S. Pat. Nos. 4,001,524, 4,127,750, and 4,792,939 (which are herein incorporated by reference) generally describe duplexers. U.S. Pat. No. 6,472,952, which is herein incorporated by reference, generally describes phase shifters, which are useful in duplexers. U.S. Pat. Nos. 6,262,673 and 6,492,883, which are herein incorporated by reference, generally describe tunable duplexers. U.S. Pat. No. 6,784,837, which is herein incorporated by reference, teaches a transmit/receive module for a high power active phased array antenna system based upon a combination of Hybrid Microwave Integrated Circuit (MIC) as well as Monolithic Microwave Integrated Circuit (MMIC) technology.

The inventors and collaborators have developed related art that serves as a foundation for the instant invention. These are references 1-6, set forth below:

The active duplexer of reference 2 was designed for isolation over a wideband. The Chebyshev scaling of transconductances of transistors in a DA was shown to provide the specified isolation over a large bandwidth. The duplexer provided a gain of 5 dB but the average Transmitter-Receiver isolation was less than 15 dB in the frequency range between 3 and 5 GHz.

The active duplexer of reference 3 was designed with fixed values of capacitances on the gate and drain lines of a DA. The Transmitter-Receiver isolation achieved was about 17 dB and the gain was about 2.6 dB at 2.4 GHz.

The active duplexer of reference 4 provided a gain of 9 dB and a Transmitter-Receiver isolation of about 28 dB at 1.97 GHz. The mechanically tunable capacitors on the gate and drain lines were intended for minute adjustments of the isolation frequency and level of isolation. Many versions of this duplexer were fabricated using mechanically tunable capacitors for improved performance (reference 5), but none of them showed any improvement in isolation level or gain. Moreover, they were found to be unsuitable for repeated operation (by tuning) of the active duplexer over a desired set of frequencies in the tuning range.

All of the foregoing active duplexers (found in references 2, 3, 4, and 5) were designed for antenna configuration B (where an antenna is connected to port 4 and port 2 is terminated). In this configuration, gain is present only in the receive mode and isolation is required only between one pair of isolated ports.

Phase Shift

The required phase shift Φ between the DA cells for obtaining the isolation between ports 1 and 3 in an active duplexer is determined by the number (n) of transistors used.

The phase shift required is given by equation no. 1:

$$\Phi = \frac{180}{n} \quad (1)$$

or an integer multiple of Φ, except 180 and 360 degrees. For example, if four transistors are used for designing an active duplexer the required phase shift between transistors should be any of the following values (equation no. 2):

$$\Phi = \frac{180}{4} = 45 \quad (2)$$

or any one of 90, 135, 225, 270, and 315 degrees.

The present inventive concept is an improvement over U.S. Pat. No. 7,576,627 entitled "Electronically Tunable Active Duplexer," the entirety of which is herein incorporated by reference. The tunable active duplexer of the present inventive concept has relatively constant forward and reverse signal gains between coupled ports while providing high signal isolation between isolated ports over a tuning range.

REFERENCES

The following references are cited by number throughout this disclosure. Applicant makes no statement, inferred or direct, regarding the status of these references as prior art. Applicant reserves the right to challenge the veracity of statements made in these references, which are incorporated herein by reference.
1. J. B. Beyer, S. N. Prasad (Prasad N. Shastry), J. E. Nordman, R. C. Becker and G. Hohenwarter, "MESFET distributed amplifier design guidelines," IEEE Trans. Microwave Theory and Tech, Vol. MTT32, No. 3, pp. 268-275, 1984.
2. S. N. Prasad (Prasad N. Shastry) and Z. M. Li, "Optimal design of low crosstalk, wideband, bidirectional distributed amplifiers," 1996 IEEE MTT-S Int. Microwave Symp. Dig., San Francisco, Calif., June 1996, pp. 847-850.
3. S. N. Prasad (Prasad N. Shastry), Jalmi-Abdul Jalil, and Tuan Tu, "A 2.4 GHz T/R module for wireless transceiver applications," focused session on U.S. Wireless Technology, MTT-S European Wireless '98, Amsterdam, October 1998, pp. 237-242.
4. Sameer Naik, "PCS CDMA Receiver Front-end," Master's Research Project Report, Dept. of Electrical & Computer Engineering, Bradley University, Peoria, Ill., U.S.A., 1999.
5. Balamurugan Sundaram, "Reconfigurable Active Duplexer for Wireless Systems", Master's Research Project Report, Dept. of Electrical and Computer Engineering, Bradley University, Peoria, Ill., U.S.A., 2005.
6. S. N. Prasad (Prasad N. Shastry), "Microwave Impedance Matching Techniques", Handbook of Microwave Technology, San Diego, Calif., Academic Press, 1995, Ch. 17, pp 617-669.
7. S. Balamurugan and P. Shastry, "A novel electronically tunable active duplexer for wireless transceiver applications," in Proceedings of the 35th European Microwave Conference, Paris, France, October 2005, pp. 1767-1770.
8. S. Balamurugan and P. Shastry, "A novel electronically tunable active duplexer for wireless transceiver applications," IEEE Transactions on Microwave Theory And Techniques, Vol. 54, No. 6, June 2006, pp. 2584-2592.
9. S. Sureshbabu, S. Balamurugan, and P. N. Shastry, "A Novel Tunable Active Duplexer MMIC," European Microwave Integrated Circuit (EuMIC) Conference, Oct. 28-Nov. 2, 2012.

SUMMARY

Objects of the instant invention include providing an electronically tunable active duplexer ("ETAD") system and related methods for wireless transceiver applications. The ETAD offers improved precision in antenna tuning to obtain higher isolation of a desired frequency and provides repeatable, electronically tunable, isolations over a desired band of frequencies, which is a considerable improvement over the active duplexers described in references 2, 3, and 4. In a preferred embodiment, the ETAD comprises a phase shifting network between distributed amplifier gain cells, wherein the phase shifting network does not require any varactor diode, but instead achieves the desirable variable capacitance by electronically tuning the gate voltage of a transistor. This feature, in phase shifting networks enables one to electronically tune, with ease and precision, the frequency at which isolation is desired, over a band in both transmit and receive modes of operations. Unlike the mechanically adjustable capacitor configuration (reference 4), the electronically tunable configuration of this invention allows precise tuning to obtain higher isolation at a desired frequency. More preferably, the distributed amplifier gain cells of the ETAD comprise GaAsFET, gate and drain line inductors. Most preferably, the ETAD optionally comprises bandpass filters on both transmission and receiver signal paths. The ETAD can be used in either antenna configuration A or B (supra).

The inventors have developed a novel way of changing the phase shift through the phase-shifting networks without varactor diodes. The variable drain-source capacitance needed has been realized by tuning the gate voltage of a transistor. Further, the range of tunable voltage to achieve the necessary frequency of isolation is well within the maximum power supply voltage to the chip, thus enabling single power supply operation of the active duplexer. Due to the simplicity of this design, it can be adapted to any other device technology.

An exemplary embodiment of an electronically tunable active duplexer MMIC of the present inventive concept is provided. The exemplary embodiment provides an electronically tunable isolation of 20 to 45 dB between isolated ports and a gain of 14.5 to 16.5 dB between coupled ports in the tunable range from 2.32 to 2.48 GHz in both transmit and receive modes. This chip is suitable for 2.3 GHz WiMAX and WiBro applications.

The foregoing and other objects are intended to be illustrative of the general inventive concept and are not meant in a limiting sense. Many possible embodiments of the invention may be made and will be readily evident upon a study of the entire specification and accompanying drawings comprising a part thereof. Various features and subcombinations of the general inventive concept may be employed without reference to other features and subcombinations. Other objects and advantages of the general inventive concept will become apparent from the following description taken in connection with the accompanying drawings, wherein is set forth by way of illustration and example, an embodiment of this invention and various features thereof.

BRIEF DESCRIPTION OF THE DRAWINGS

These and/or other aspects and utilities of the present general inventive concept will become apparent and more readily appreciated from the following description of the embodiments, taken in conjunction with the accompanying drawings. For the purpose of illustration, forms of the present general inventive concept which are presently preferred are shown in the drawings; it being understood, however, that the general inventive concept is not limited to the precise arrangements and instrumentalities shown. In the drawings:

FIG. 4 depicts an exemplary capacitance tuning circuit.

DETAILED DESCRIPTION

The present general inventive concept provides an electronically tunable active duplexer. One embodiment of the tunable active duplexer has been designed and produced in the form of a MMIC chip. The tunable active duplexer includes a capacitance tuning circuit. One exemplary embodiment of the tunable active duplexer gave a gain of 14 dB and isolation ranging from 21 to 44 dB in the tuning range (160 MHz) in both transmit and receive modes of operations. The return losses at all four ports were greater than 8 dB. This duplexer chip is suitable for 2.3 GHz WiMax and WiBro applications. The present inventive concept provides several advantages over the prior art.

Figure 1:
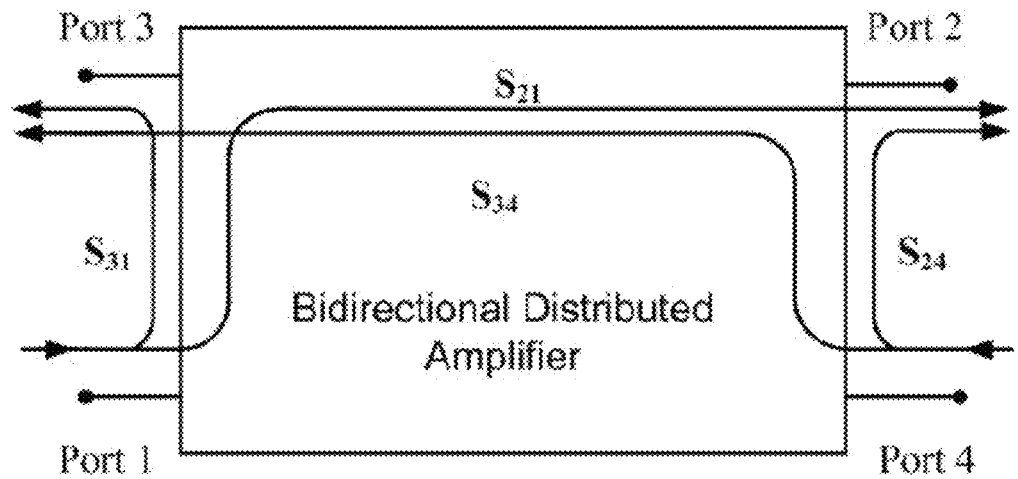
FIG. 1 depicts the signal paths in a distributed amplifier.
Figure 2:
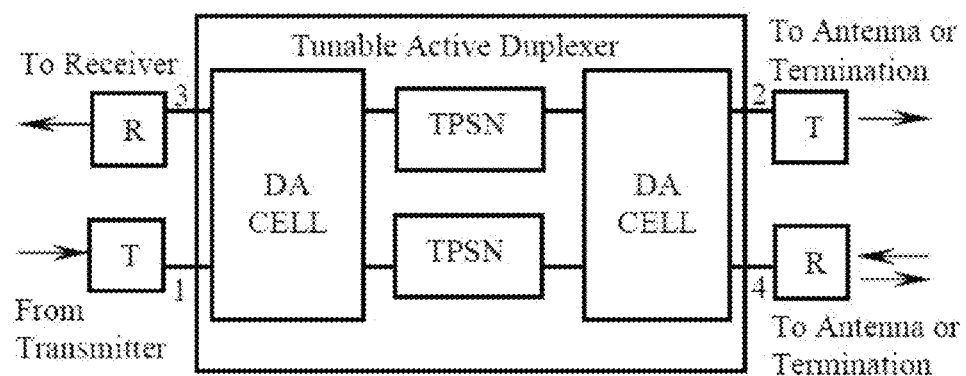
FIG. 2 depicts a Tunable Active Duplexer. Ports 1, 2, 3, and 4 are labeled. Bandpass filters are labeled, T for filters designed to pass transmit signals and R for filters designed to pass receive signals. Tunable Phase Shifting Networks are indicated by TPSN.

The dynamic range, the power handling capability and the noise figure of the active duplexer will depend upon the chosen transistor. In either antenna configuration A or B, tradeoffs between the dynamic range, power handling capability and noise figure will always be present. Moreover, in antenna configuration A the receiver filter R connected to port 4 of the duplexer shown in FIG. 2 is not required if improved noise performance is essential and additional isolation is not necessary. Therefore, the primary advantages of this invention, namely gain in both transmit and receive modes and at the same time isolation between both pairs of isolated ports along with optional antenna configurations, can be utilized appropriately to achieve the desired duplexer specifications.

An exemplary embodiment of the present inventive concept has been realized as a MMIC, which is a significant improvement in terms of form-factor reduction. Tunable duplexers of the prior art were demonstrated on a radio frequency PCB (Printed Circuit Board) which had a size of 110 mm×80 mm×0.5 mm. The relative dielectric constant of the substrate (PCB) was 2.9. The prior art circuits were fabricated using hybrid microwave integrated circuit (MIC) technology. In this technology, packaged discrete components such as transistors, resistors, capacitors, inductors, and diodes, that are made of different materials, are assembled on a PCB having metal traces known as microstriplines; thus forming an electronic circuit.

According to an embodiment of the present inventive concept, the size (3.3 mm×2.3 mm×0.1 mm) has been reduced by a factor of more than 1000, thereby enabling the usage of the invention in applications where size of the circuit is critical.

The size reduction was accomplished by implementing the design on a 0.1 mm thick GaAs (Gallium Arsenide) wafer having a relative dielectric constant of 12.9. Due to reduction in thickness and increase in relative dielectric constant of the substrate the size reduction is achieved. The Monolithic Microwave Integrated Circuit (MMIC) technology used in an embodiment of the present invention allows the fabrication of active (transistor) and passive (resistor, capacitor, inductor, and microstriplines) components of the circuit in the same substrate material. The lengths of the metal traces (microstriplines) are drastically reduced in a MMIC; thus resulting in smaller size and superior performance relative to the same circuit fabricated using hybrid MIC technology.

Another advantage of the present inventive concept includes providing a way of changing the phase shift through a phase-shifting network in the active duplexer without using varactor diodes. The variable capacitance (previously achieved by changing the voltage of a varactor diode) needed in a phase shifting network in order to tune the operating frequency has been realized by tuning the gate voltage of a transistor. Thus, in an embodiment of the present inventive concept, only transistors are used for both active duplexer operation and frequency tuning. The implementation of the prior art (varactor diode based design) in the form of a MMIC required that the chosen foundry process supported technologies needed for both transistors and varactor diodes; and hence would be expensive and cumbersome. Since the embodiment of the present inventive concept utilizes only transistors, it lends itself to easier implementation across multiple active device and material technologies including but not limited to CMOS (Complementary Metal Oxide Semiconductor), HBT (Hetero-Junction Bipolar Transistor), HEMT (High Electron Mobility Transistor), GaN (Gallium Nitride), InP (Indium Phosphide), and SiGe (Silicon Germanium).

The prior art varactor-tuned phase-shifting networks required tuning voltages as high as 30 V and the transistors in the circuit needed a bias voltage of 2 V. Therefore, separate power supplies were needed for varactor diodes and transistors. By employing the present inventive concept, another advantage is realized, the tuning voltages needed to tune the phase-shifting network and the voltage needed to bias the transistors are derived from a single 5 V power supply. This is possible because in an embodiment of the present inventive concept, the transistor-tuned phase-shifting network requires only a maximum of 5 V. The tuning voltages can be obtained by means of simple resistive voltage dividers.

In the prior art, the tunable phase-shifting networks were used only to obtain the required signal isolation between the isolated ports. Another advantage of the present inventive concept is that the tunable phase shifting networks are used not only to obtain the required signal isolation between isolated ports, but also to obtain improved impedance matching at the ports. This has been accomplished by incorporating tunable phase shifting networks in the impedance matching networks at the ports.

Figure 3:
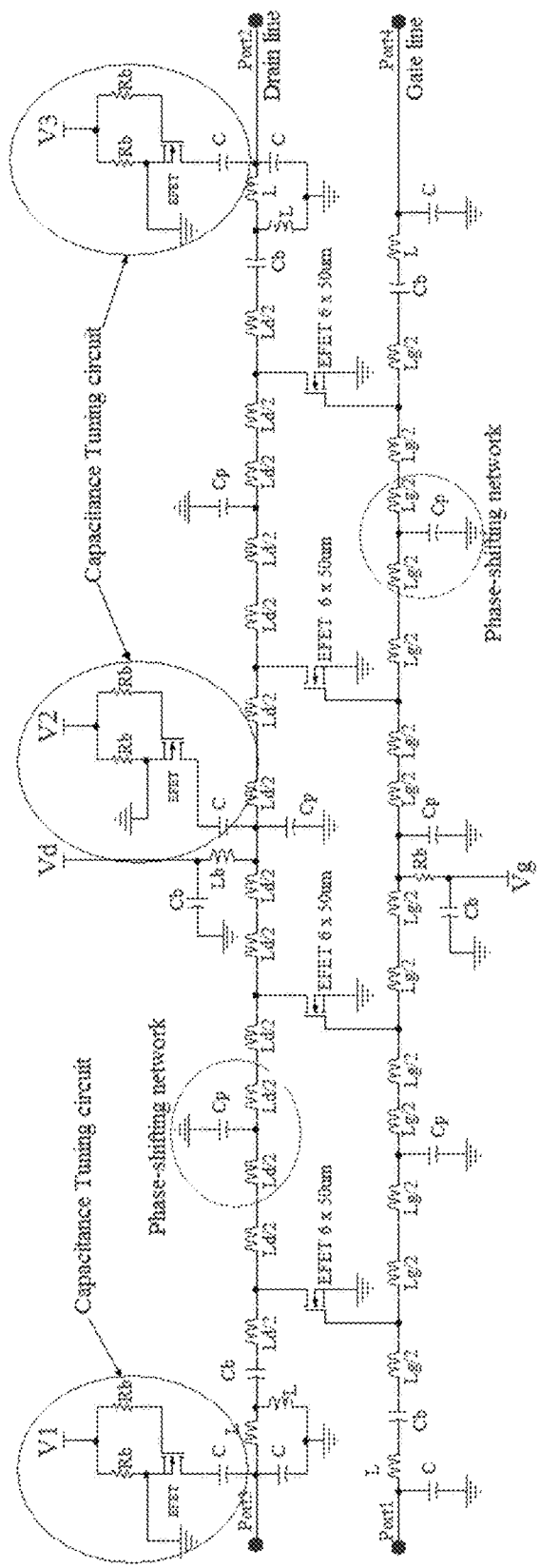
FIG. 3 depicts an exemplary circuit diagram of an Electronically Tunable Active Duplexer. V1, V2 and V3 each represent a capacitance tuning circuit, an example of which is enlarged and shown in greater detail in FIG. 4. $V_d$ and $V_g$ represent the DC Bias to the transistors.

A schematic of the exemplary tunable active duplexer is shown in FIG. 3. The design approach used is explained in detail in reference [8]. Four 0.5 μm enhancement mode p-HEMTs (6×50 μm) from TriQuint Semiconductor TQPED process were selected for the design. The DC power supply to the chip was Vd=4.5V and Vg=0.6V with a total current consumption of 53 mA. The frequency ($f_o$) selected for isolation between ports 1 and 3 and, 2 and 4 is 2.3 GHz.

In this example design, a phase shift of Φ=90° was selected. Cut-off frequency of the gate and drain-lines was found using the following equation, in accordance with reference [8].

$$\Phi = m\cos^{-1}\left[1 - 2\left(\frac{f_o}{f_c}\right)^2\right] \quad (3)$$

In equation 3, m is the number of π-sections between transistors, $f_o$ is the frequency at which isolation is desired, and $f_c$ is the cutoff frequency of the gate and drain lines, in accordance with reference [8]. Two π sections (m=2) were chosen for this exemplary design.

From equation (3), for $f_o$=2.3 GHz, $f_c$=6 GHz, the gate and drain line inductor (L) and capacitor (C) values were calculated using the following equations, in accordance with reference [8].

$$f_c = \frac{1}{\pi\sqrt{LC}} \quad (4)$$

$$Z_0 = \sqrt{\frac{L}{C}} \quad (5)$$

$Z_0$ was chosen to be 50Ω. From equations (4) and (5), $L(L_g \& L_d)$=2.65 nH; $C(C_p)$=1 pF.

Typical phase-shifting networks on gate and drain lines of an active duplexer are shown in FIG. 3. For obtaining maximum isolation between ports 1 and 3 and, 2 and 4 at the frequency of interest, the phase shifts through the phase shifting networks have to be realized accurately at that frequency. In order to enable accurate adjustment of the phase shift, a capacitance tuning circuit was designed and implemented.

Figure 4:
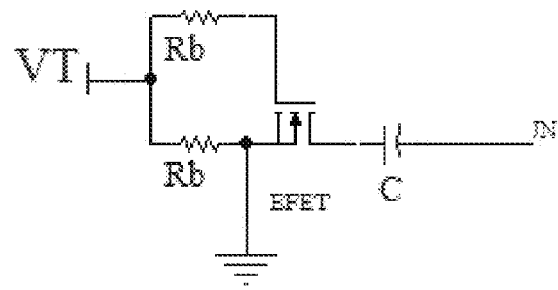
FIG. 4 depicts an enlarged and greater detail exemplary sub-component of the exemplary schematic diagram of FIG. 3.

The exemplary capacitance tuning circuit shown in FIG. 4 was designed and incorporated in the active duplexer, as shown in FIG. 3. This circuit enables the adjustment of the phase shift (φ) through the phase shifting networks and also impedance matching at ports 2 and 3.

A variable capacitance Cv is realized between terminal IN and GND by adjusting the gate-source voltage of the transistor. The capacitance Cv is equivalent to capacitor C in series with the drain-source capacitance (Cds) of the transistor. As the gate-source voltage is increased, Cds increases. This in turn increases the capacitance Cv. The two resistors (Rb) act as a voltage divider and also provide isolation of the DC tuning voltage supply (VT) from RF signals. The exemplary tunable capacitance circuit of FIG. 4 has a simulated capacitance (Cv) range from 100 fF to 1500 fF for a gate-source voltage (VT) varying from 0 to 1V.

The exemplary duplexer schematic shown in FIG. 3 was implemented as a MMIC. The circuit was simulated and optimized using Agilent's Advanced Design System (ADS). The simulation showed forward and reverse gains ($S_{21}$ and $S_{34}$) of 17 dB and a return loss of more than 10 dB at all four ports in the range 2-2.7 GHz. With various tuning voltage combinations, the frequency of isolation ($S_{31}$ and $S_{24}$) was tunable from 2.25 to 2.5 GHz. The amplifier had a noise figure of 3.2 dB and a P1 dB of 13 dBm at 2.3 GHz. The amplifier was stable.

Since the duplexer has four RF ports and the test facility had only two RF probe positioners, the same circuit was fabricated with four different port termination combinations. Ports 3 and 4 and, ports 1 and 2 were terminated with 50 ohm on-chip resistors to measure forward and reverse gains and return losses. Ports 2 and 4 and, ports 1 and 3 were terminated with 50 ohm on-chip resistors to measure isolations.

Figure 5:
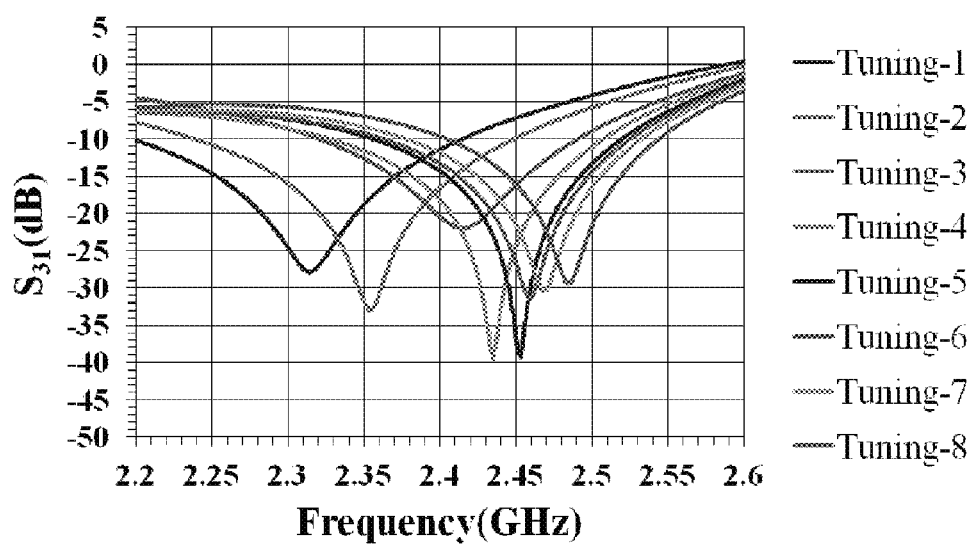
FIG. 5 depicts measured tunable isolation plots ($S_{31}$ of FIG. 1) at various tuning voltage combinations (see Table), where the isolation is achieved between ports 1 and 3.
Figure 6:
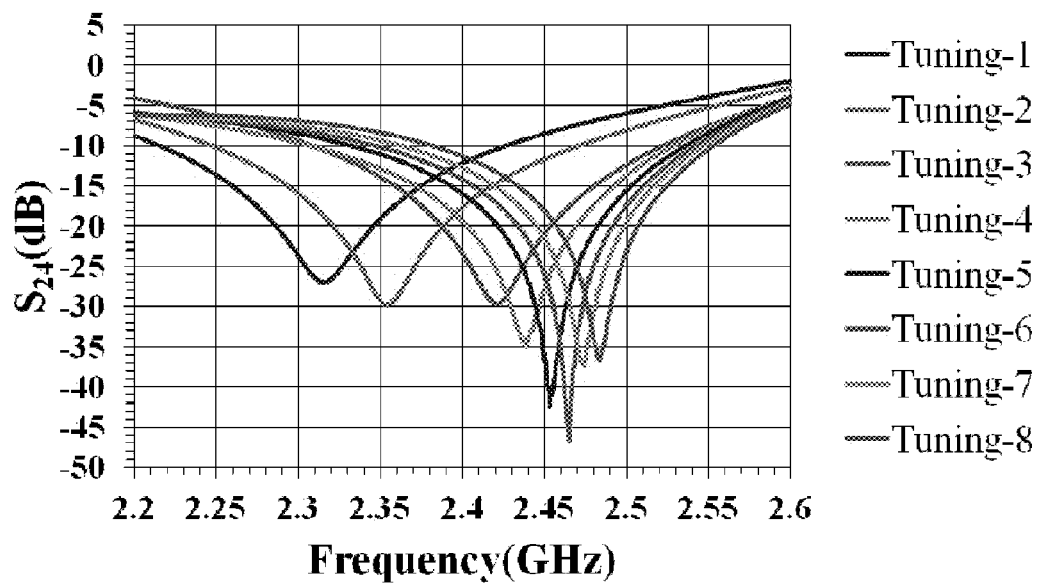
FIG. 6 depicts measured tunable isolation plots ($S_{24}$ of FIG. 1) at various tuning voltage combinations (see Table) between ports 2 and 4.

All measurements were done in the frequency range 2 to 3 GHz since the design frequency is 2.3 GHz. FIGS. 5 and 6 contain plots of isolation between ports (S31 and S24) for various tuning voltage combinations (see TABLE below). The isolations were between 21 and 44 dB in the tuning range (2.32-2.48 GHz).

Figure 7:
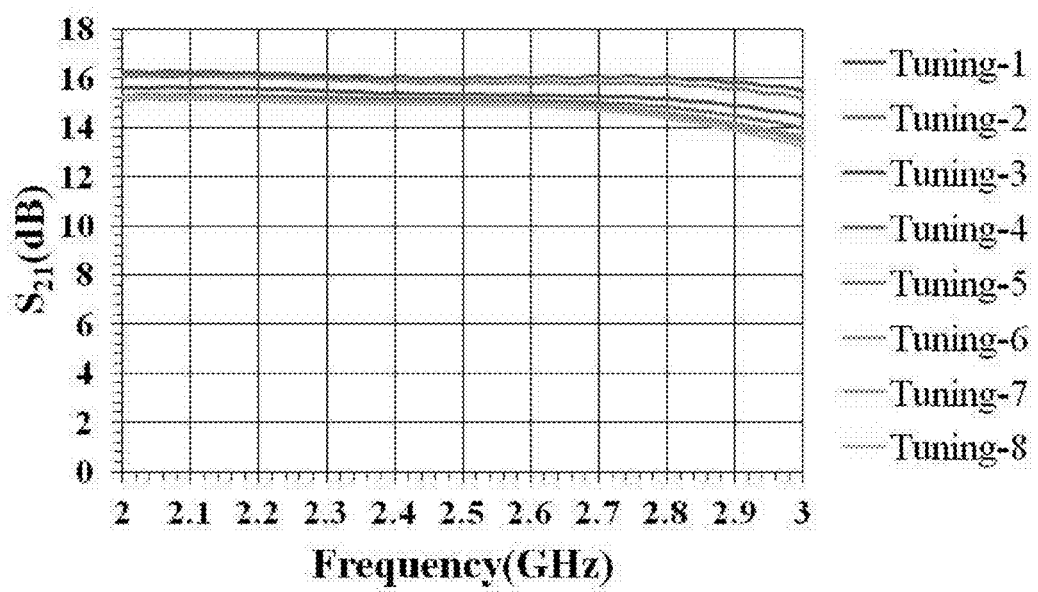
FIG. 7 depicts measured gains ($S_{21}$ of FIG. 1) in the transmit mode at various tuning voltage combinations (see Table).
Figure 8:
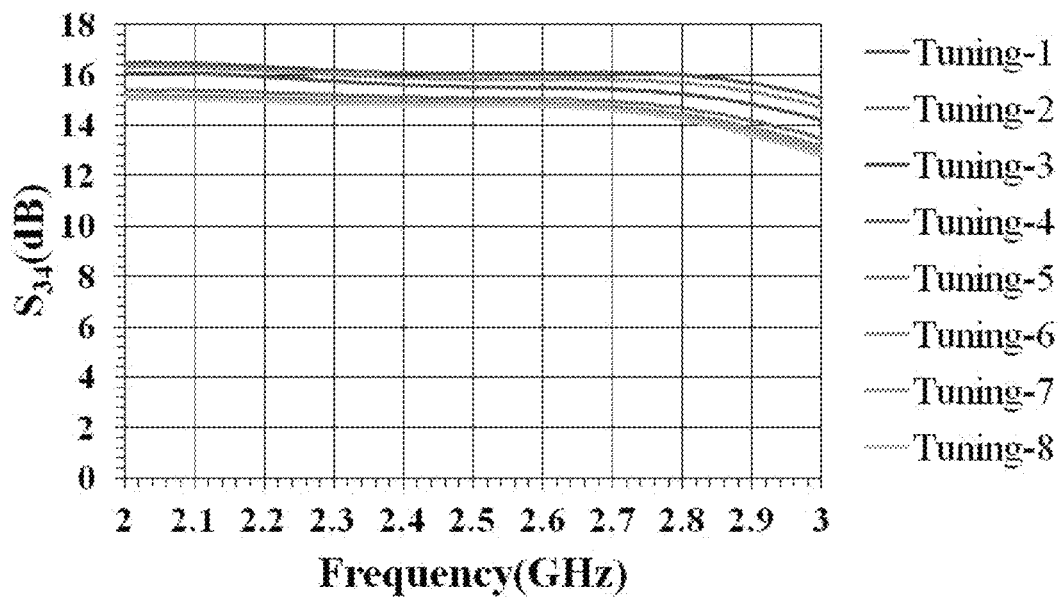
FIG. 8 depicts measured gains ($S_{34}$ of FIG. 1) in the receive mode at various tuning voltage combinations (see Table).
Figure 9:
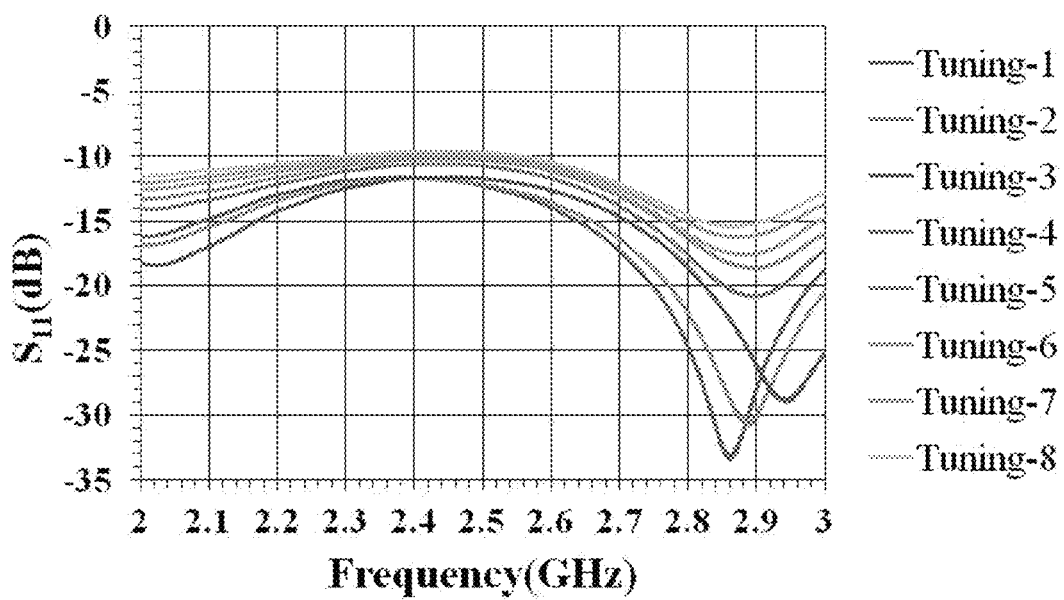
FIG. 9 depicts measured forward input return loss ($S_{11}$) for various tuning voltage combinations (see Table).
Figure 10:
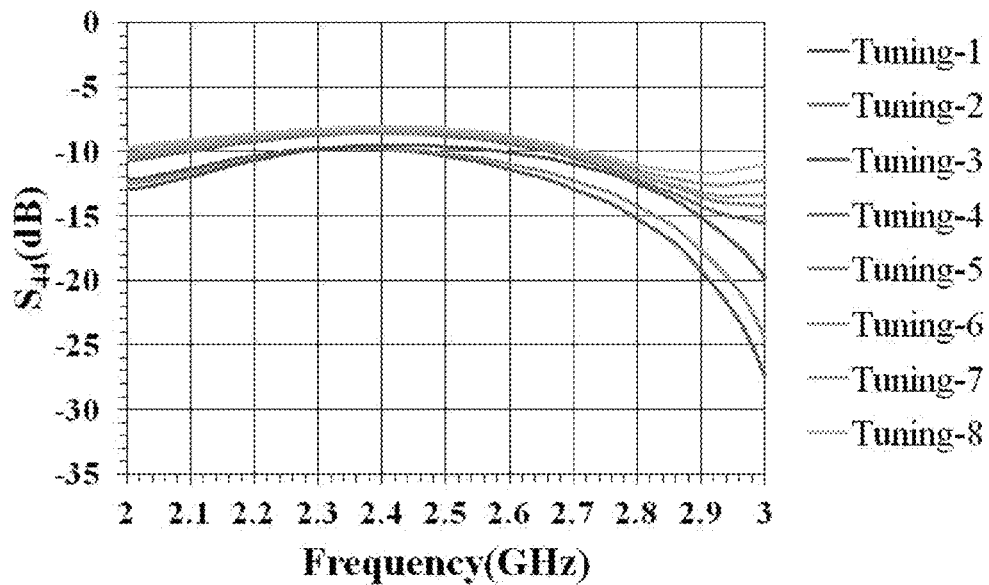
FIG. 10 depicts measured reverse input return loss ($S_{44}$) for various tuning voltage combinations (see Table).
Figure 11:
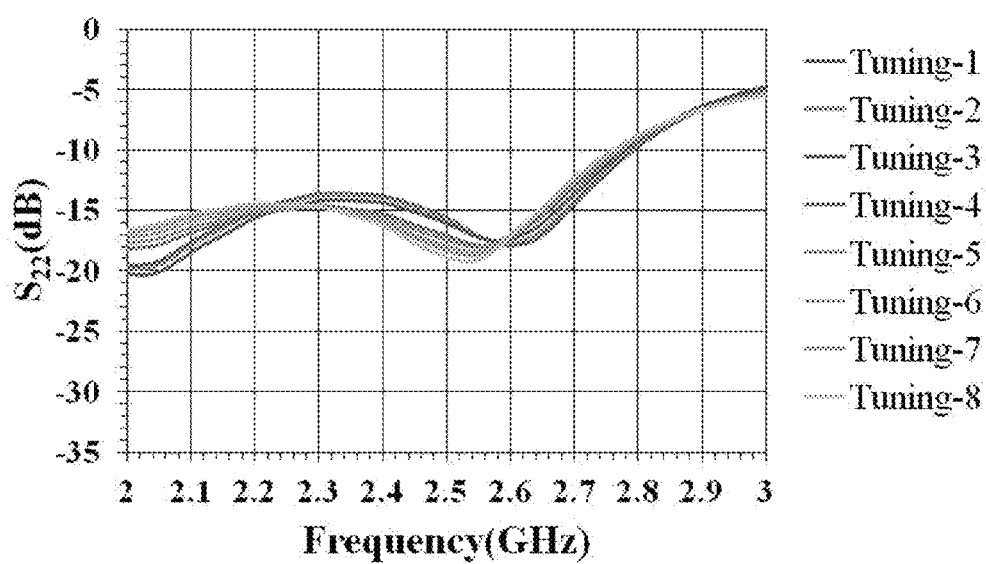
FIG. 11 depicts measured forward output return loss ($S_{22}$) for various tuning voltage combinations (see Table).
Figure 12:
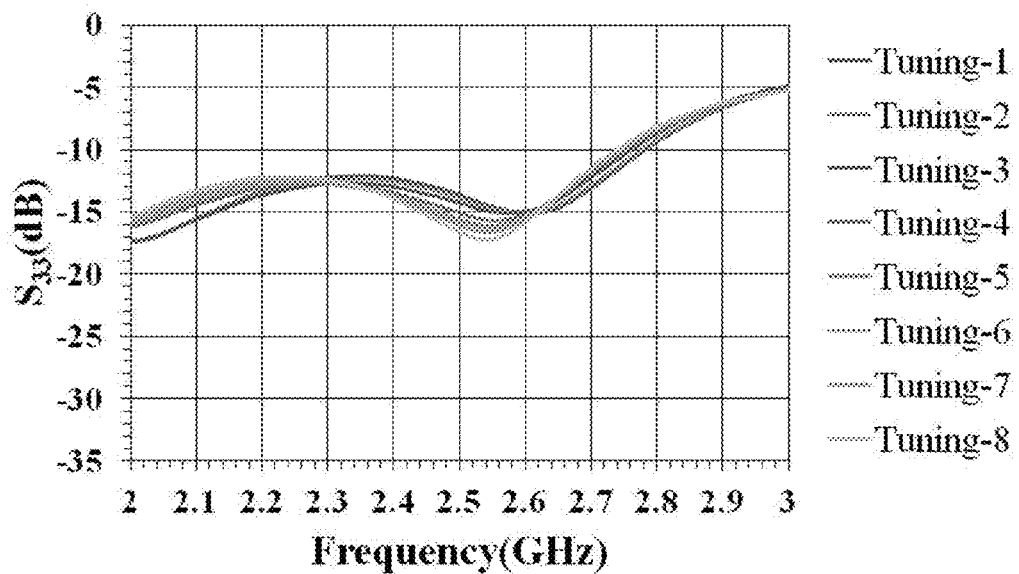
FIG. 12 depicts measured reverse output return loss ($S_{33}$) for various tuning voltage combinations (see Table).
Figure 14:
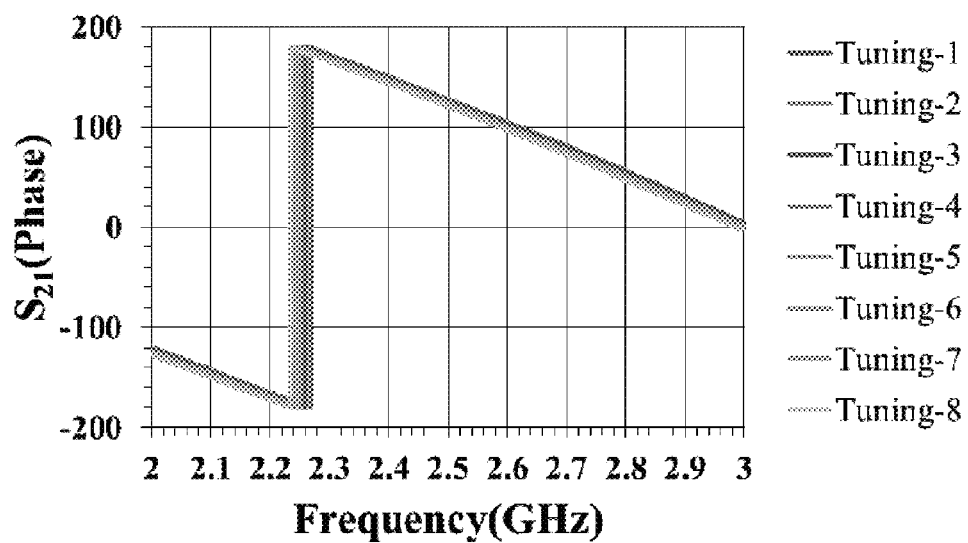
FIG. 14 depicts measured phases of transmission coefficients in the transmit mode ($S_{21}$).
Figure 15:
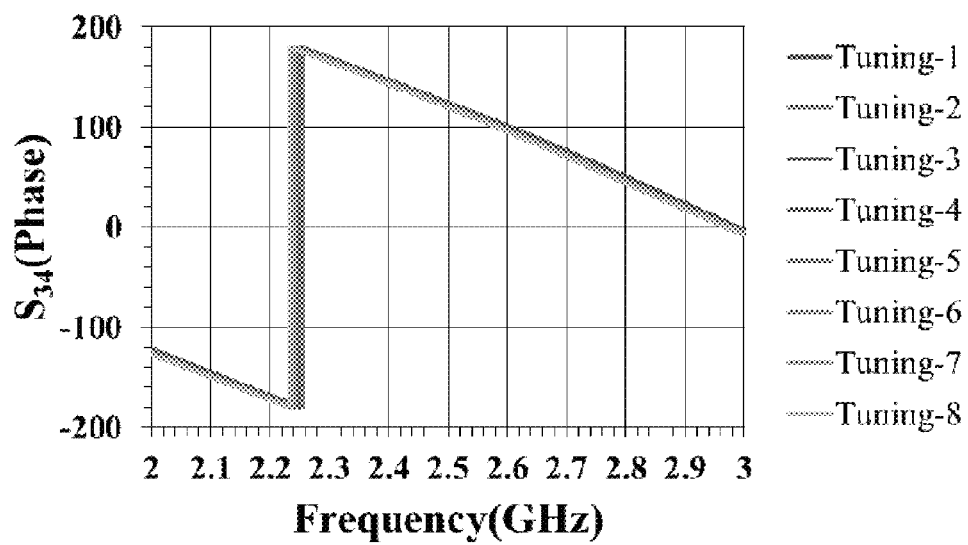
FIG. 15 depicts measured phases of transmission coefficients in the receive mode ($S_{34}$).

The forward and reverse gains (S21 and S34) are shown in FIGS. 7 and 8. The gains in forward and reverse directions vary from 16.2 to 14.8 dB in the range 2 to 3 GHz. The phases of S21 and S34 varied linearly in the range 2 to 3 GHz, as shown in FIGS. 14 and 15.

The input return losses (S11 and S44) and output return losses (S22 and S33) are shown in FIGS. 9-12. The return losses at all four ports are greater than 8 dB in the tuning range.

Figure 13:
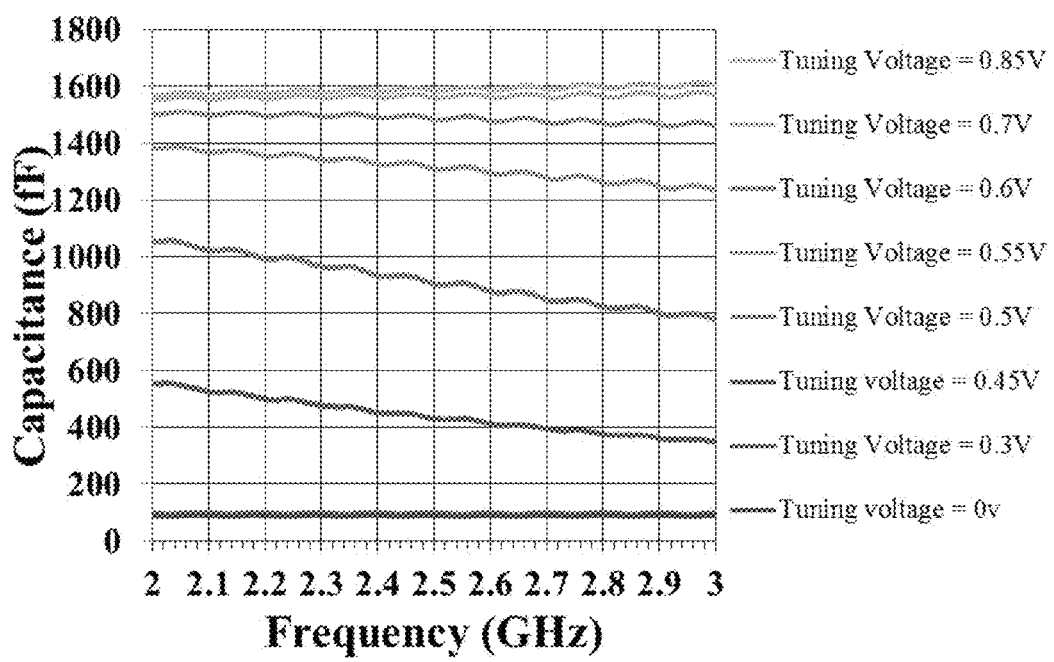
FIG. 13 depicts measured capacitance at various tuning voltage combinations from 0 to 0.85V.

The TABLE below shows the values of isolation and gain in both forward and reverse directions for various tuning voltages. FIG. 13 shows the capacitance provided by the capacitance tuning circuit at tuning voltages ranging from 0 to 0.85V.

TABLE

| Tuning | Tuning Voltages (Volts) | | | Freq | Isolation (dB) | | Gain (dB) | |
|---|---|---|---|---|---|---|---|---|
| | V1 | V2 | V3 | (GHz) | $S_{31}$ | $S_{24}$ | $S_{21}$ | $S_{34}$ |
| 1 | 0 | 0.40 | 0.44 | 2.32 | 27.0 | 27.0 | 16.0 | 16.2 |
| 2 | 0 | 0.45 | 0.45 | 2.36 | 32.8 | 29.8 | 15.9 | 15.9 |
| 3 | 0 | 0.50 | 0.48 | 2.42 | 21.8 | 29.4 | 15.4 | 15.6 |

TABLE-continued

| Tuning | Tuning Voltages (Volts) | | | Freq | Isolation (dB) | | Gain (dB) | |
|---|---|---|---|---|---|---|---|---|
| | V 1 | V 2 | V 3 | (GHz) | $S_{31}$ | $S_{24}$ | $S_{21}$ | $S_{34}$ |
| 4 | 0.50 | 0.45 | 0.54 | 2.43 | 38.7 | 35.0 | 15.2 | 15.1 |
| 5 | 0.52 | 0.45 | 0.57 | 2.45 | 38.0 | 38.0 | 15.0 | 14.9 |
| 6 | 0.54 | 0.43 | 0.59 | 2.46 | 31.4 | 44.0 | 15.0 | 14.8 |
| 7 | 0.56 | 0.41 | 0.62 | 2.47 | 30.7 | 37.0 | 15.0 | 14.8 |
| 8 | 0.58 | 0.38 | 0.69 | 2.48 | 29.4 | 37.0 | 14.9 | 14.8 |

Thus, while the present general inventive concept has been shown in the drawings and fully described above with particularity and detail in connection with what is presently deemed to be the most practical and preferred embodiment(s) of the invention, it will be apparent to those of ordinary skill in the art that many modifications thereof may be made without departing from the principles and concepts set forth herein, including, but not limited to, variations in size, materials, shape, form, function and manner of operation, assembly and use; applications in contexts outside wireless transceivers.

It is also to be understood that the claims to follow are or will be intended to cover all of the generic and specific features of the invention herein described, and all statements of the scope of the invention which, as a matter of language, might be said to fall therebetween. Hence, the proper scope of the present general inventive concept should be determined only by the broadest interpretation of such claims so as to encompass all such modifications as well as all relationships equivalent to those illustrated in the drawings and described in the specification.

Finally, it will be appreciated that the purpose of the annexed Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

What is claimed is:

1. A duplexer comprising a first port, a second port, a third port, a fourth port, at least two distributed amplifier DA gain cells, and at least one tunable phase shifting network TPSN between and connecting the DA cells, wherein the TPSN comprises one or more variable reactive component wherein the TPSN is tuned such that impedance at one of said first port, second port, third port, or fourth port matches impedance at another of said first port, second port, third port, or fourth port.

2. The duplexer of claim 1, wherein said variable reactive component comprises a variable inductor.

3. The duplexer of claim 1, wherein said variable reactive component comprises a variable capacitor.

4. The duplexer of claim 1, wherein the duplexer is electronically tunable by tuning the gate voltage of one or more transistor.

5. The duplexer of claim 1, wherein each of said DA cell comprises at least one signal amplifying device, resistor, inductor and capacitor.

6. The duplexer of claim 1, wherein each of said DA cell comprises a field effect transistor (FET) and gate and drain line inductors.

7. The duplexer of claim 6, wherein the FET is a gallium arsenide High Electron Mobility Transistor GaAsHEMT.

8. The duplexer of claim 5 wherein the at least one inductor and the at least one capacitor are lumped elements.

9. The duplexer of claim 5 wherein one or more of the at least one inductor and one or more of the at least one capacitor are transmission lines.

10. The duplexer of claim 1, further comprising a receiver R bandpass filter connected to the third port or to the fourth port.

11. The duplexer of claim 1, further comprising a transmission T bandpass filter connected to the first port or to the second port.

12. The duplexer of claim 1, wherein an antenna is connected to the fourth port and the second port is terminated.

13. The duplexer of claim 1, wherein an antenna is connected to the second port and the fourth port is terminated.

14. The duplexer of claim 1, wherein an antenna is connected to both the second and fourth ports.

15. The duplexer of claim 1 comprising a plurality of series inductors of high impedance microstripelines.

16. The duplexer of claim 1 comprising a plurality of fixed shunt capacitors of low impedance microstripelines.

17. The duplexer of claim 1, wherein the duplexer is a Monolithic Microwave Integrated Circuit (MMIC) device.

18. The duplexer of claim 1, wherein the duplexer is a Radio Frequency Integrated Circuit (RFIC) device.

19. The duplexer of claim 1, wherein the duplexer is a Hybrid Microwave Integrated Circuit (Hybrid MIC) device.

20. The duplexer of claim 1, wherein the duplexer comprises a material of one or more of Silicon (Si), Silicon Germanium (SiGe), Gallium Arsenide (GaAs), Gallium Nitride (GaN), and Indium Phosphide (InP).

21. The duplexer of claim 1, wherein the duplexer comprises an active device technology of one or more of Complementary Metal Oxide Semiconductor (CMOS), Hetero-Junction Bipolar Transistor (HBT), High Electron Mobility Transistor (HEMT), and Bipolar Complementary Metal Oxide Semiconductor (BiCMOS).

22. The duplexer of claim 1, wherein the TPSN is tuned to obtain isolation between ports.

23. An electronically tunable active duplexer, comprising two or more tunable phase shifting networks TPSN, two or more distributed amplifier DA gain cells, a first port for transmission of a signal, a second port for antenna or termination, a third port for receiving a signal, a fourth port for antenna or termination, wherein each of said TPSN comprises one or more variable reactive component, wherein at least one of said two or more TPSN is tuned such that impedance at one of said first port, second port, third port, or fourth port matches impedance at another of said first port, second port, third port, or fourth port.

24. The electronically tunable active duplexer of claim 23, wherein said variable reactive component comprises a variable inductor.

25. The electronically tunable active duplexer of claim 23, wherein said variable reactive component comprises a variable capacitor.

26. The electronically tunable active duplexer of claim 23, wherein each of said DA cell comprises at least one signal amplifying device, resistor, inductor and capacitor.

27. The electronically tunable active duplexer of claim 23, wherein each of said DA cell comprises a field effect transistor (FET) and gate and drain line inductors.

28. The electronically tunable active duplexer of claim 26 wherein one or more of the at least one inductor and one or more of the at least one capacitor are lumped elements.

29. The electronically tunable active duplexer of claim 23, further comprising a receiver R bandpass filter connected to the third port or to the fourth port.

30. The electronically tunable active duplexer of claim 23, further comprising a transmission T bandpass filter connected to the first port or to the second port.

31. The electronically tunable active duplexer of claim 23, wherein an antenna is connected to the fourth port and the second port is terminated.

32. The electronically tunable active duplexer of claim 23, wherein an antenna is connected to the second port and the fourth port is terminated.

33. The electronically tunable active duplexer of claim 23, wherein an antenna is connected to both the second and fourth ports.

* * * * *